(12) United States Patent
Santangelo

(10) Patent No.: US 6,403,438 B1
(45) Date of Patent: Jun. 11, 2002

(54) PROCESS FOR MANUFACTURING A RESISTIVE STRUCTURE USED IN SEMICONDUCTOR INTEGRATED CIRCUITS

(75) Inventor: Antonello Santangelo, Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/473,896

(22) Filed: Dec. 28, 1999

(30) Foreign Application Priority Data

Dec. 29, 1998 (EP) .............................. 98830797

(51) Int. Cl.[7] .............................................. H01L 21/20
(52) U.S. Cl. ..................................................... 438/383
(58) Field of Search ........................ 438/384, 382–383, 438/385, 386–392, 393–395, 396–399

(56) References Cited

U.S. PATENT DOCUMENTS

| | | | |
|---|---|---|---|
| 4,411,708 A | 10/1983 | Winhan | 148/1.5 |
| 4,672,738 A | 6/1987 | Stengl et al. | 29/576 B |
| 5,424,239 A | * 6/1995 | Sweeney | 438/385 |
| 5,462,889 A | * 10/1995 | Tsukada et al. | 438/385 |

FOREIGN PATENT DOCUMENTS

EP 0 400 934 A2 12/1990

OTHER PUBLICATIONS

S. Wolf and R.N. Tauber, Silicon Processing for the VLSA Era. vol. 1. Lattice Press, 1986. p. 306.*

* cited by examiner

*Primary Examiner*—Charles Bowers
*Assistant Examiner*—Craig Thompson
(74) *Attorney, Agent, or Firm*—Lisa K. Jorgenson; Robert Iannucci; Seed IP Law Group PLLC

(57) ABSTRACT

A process for manufacturing a resistive structure that has a polysilicon strip laid above a semiconductor substrate is presented. The process begins by using a mask to cover the polysilicon strip. Then, several apertures are made in the mask until portions of the semiconductor strip are uncovered. Next, a dopant is implanted in the polysilicon semiconductor strip through the apertures. Finally, the resistive structure is subjected to a thermal process for diffusing the dopant in such a way to obtain a variable concentration profile in the semiconductor strip.

26 Claims, 3 Drawing Sheets

PROCESS FOR MANUFACTURING A RESISTIVE STRUCTURE USED IN SEMICONDUCTOR INTEGRATED CIRCUITS

TECHNICAL FIELD

The present invention relates to a process for manufacturing a resistive structure used in semiconductor integrated circuits, and, more particularly, to a process for manufacturing a resistive structure having at least one semiconductor strip above a semiconductor substrate.

BACKGROUND OF THE INVENTION

Embodiments of the invention relate to a process for manufacturing a resistive structure for applications in radio-frequency and the following description is made with reference to this field of application with the only purpose of simplifying the explanation.

Passive components are often used in the manufacturing of integrated circuits, such as resistors that are formed by polysilicon strips which lay above a semiconductor substrate. The polysilicon may be in some cases be a doped polysilicon.

These resistors often can have resistivity values extending over a range of five orders of magnitude (10 ohm–1 Mohm). Resistors used in high frequency applications also require a low parasitic capacitance with respect to the substrate. Because these components typically use only one polysilicon substrate having a predetermined resistivity, their size cannot be optimized with respect to the parasitic component.

If a low conductivity material is used in resistor manufacturing, thereby obtaining high resistance values, it is necessary to manufacture a component having a minimum width but a considerable length.

Moreover, if the resistive component will be subjected to high current densities, then in order to obtain the required resistance value the resistor will have to have larger width and length measurements than if it were not subjected to the high current densities.

Prior methods of forming resistive doped polysilicon strips included successive implantation steps with different doses, using lithographic methods to protect some of the strips from some of the implantations. In particular, in those methods all of the polysilicon strips that will be used for resistive structures are doped in a first ion implantation process. This first process is carried out with a dose of dopant necessary for obtaining the resistive structures with the highest value.

Using a subsequent lithographic process, the polysilicon strips which will constitute the resistive structures with the highest value are masked, and the remaining ones will be exposed to a second implantation process. This process in conjunction with the above process allows the formation of a resistive structure with a lower value.

Using another ion implantation and photolithographic process, it is possible to obtain strips of polysilicon with three different values of resistivity. It is then possible to use the strips having a low resistivity to form the resistor at lower resistance and those at high resistivity for those at high resistance.

The portions of the passive component that are needed for the interconnection with the usual level of metalization are normally subjected to all ion implantation processes in order to minimize the contact resistance between the polysilicon and the metal.

If, in order to better control the resistivity of the polycrystalline silicon at the time of the formation of the resistors semiconductor, regions are provided on the surface of the integrated circuit which are not "homologous" to the species to be implanted, it may be then necessary to use a further photolithographic process that protects the surface portions. In fact, it will be necessary to "mask" such regions during the first ion implantation process and during the following ones, in order to avoid a partial or total compensation of the dopant species present therein, which would negatively affect the contact resistance with respect to the metalization.

This prior solution requires different masking steps in order to form these passive components, increasing the complexity of the manufacturing process and its costs.

SUMMARY OF THE INVENTION

Embodiments of the invention use a process for manufacturing polysilicon resistors, in a single lithographic and ion implantation step, to obtain semiconductor regions of different resistivity. The process uses functional features that minimize the process steps needed for forming these resistors, without losing flexibility, and overcomes the drawbacks that limit the processes formed according to the prior art.

Used in the process is a manufacturing mask that has apertures for masking some portions of the same polysilicon strip during the implantation step. A subsequent thermal treatment uses a side diffusion of the dopant inside the semiconductor material to obtain high resistivity values with respect to resistors that are not subjected to any protection during the ion implantation.

Presented is a process for manufacturing a resistive structure that begins by covering a semiconductor strip with a mask. A number of apertures are formed in the mask until portions of the semiconductor strip are uncovered. A dopant is then implanted into these uncovered portions through the apertures, and the semiconductor is subjected to a thermal process that diffuses the dopant to obtain a variable concentration profile in the semiconductor strip.

The features and the advantages of the process according to embodiments of the invention will result from the following description of an embodiment thereof, which is reported for indicative and non limiting purposes with reference to the attached drawings.

Figure 1:
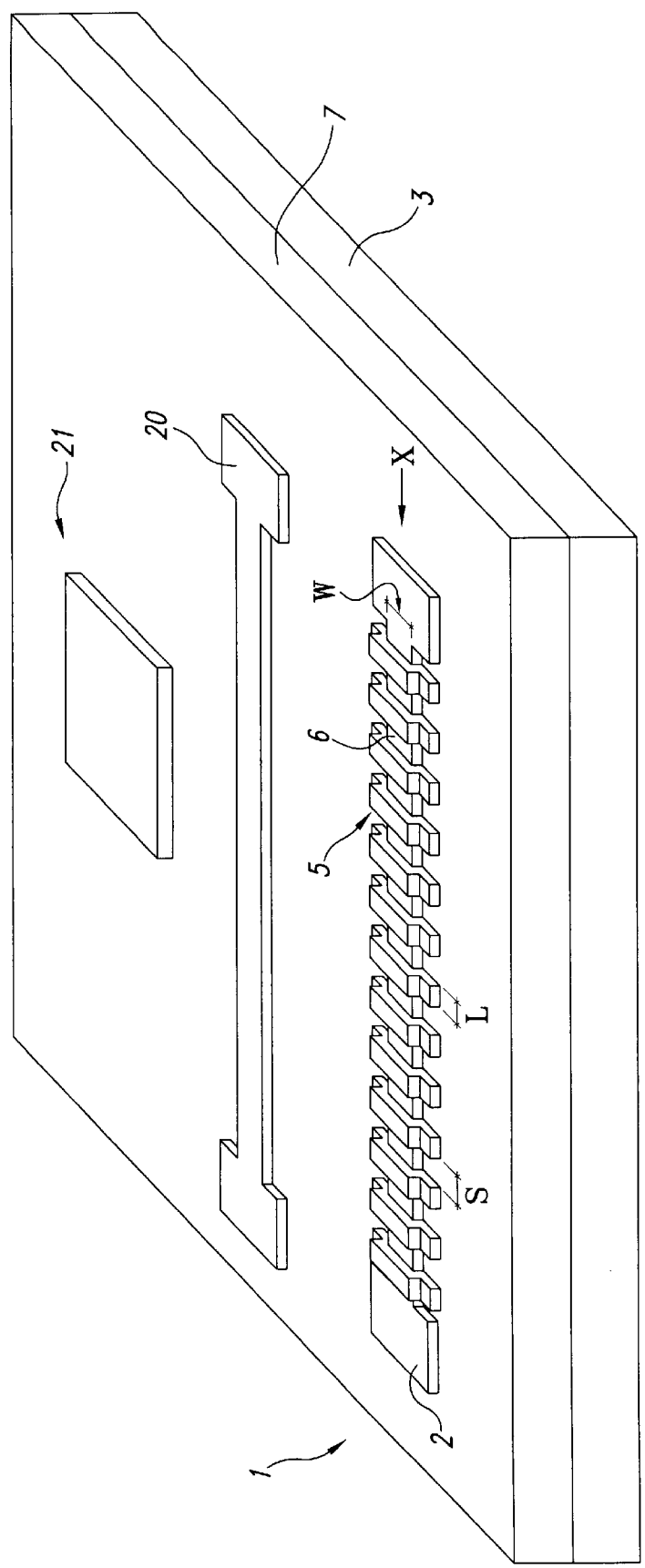
FIG. 1 shows a perspective view of a semiconductor portion on which a resistive structure is formed according to an embodiment of the invention.
Figure 2:
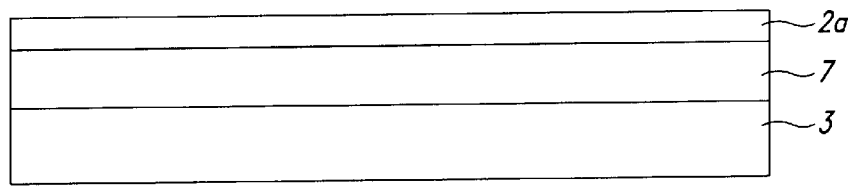
FIGS. 2 and 3 show respective cross-sectional views of a portion of a semiconductor substrate during the development of a process of manufacture according to embodiments of the invention.
Figure 3:
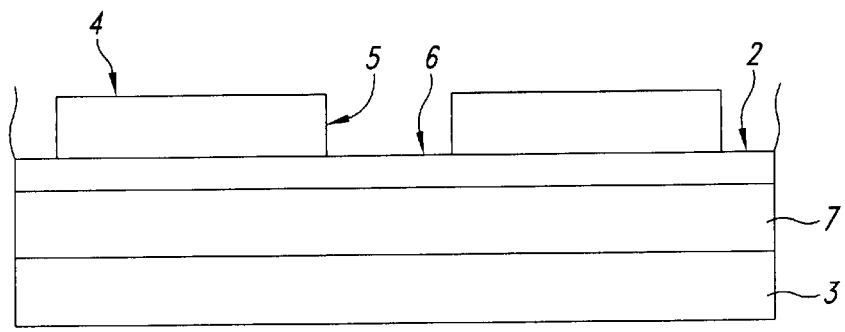

DETAILED DESCRIPTION.

The process steps described herein below do not form a complete process flow of a process for the manufacture of integrated circuits. The present invention can be practiced together with the manufacturing techniques for integrated circuits which are applied at the moment in the field, and only those process steps are enclosed, which are commonly used and which are necessary for understanding the present invention. Discussion of steps well known to those skilled in the art has been abbreviated or eliminated for brevity.

The description of the proposed process is based on the drawings which illustrate cross sections of integrated circuit portions during the manufacturing steps and they are not drawn in scale, but only in a way to illustrate the essential features of the invention.

The first step of the process for manufacturing resistive structures 1 begins with forming a dielectric layer 7 on a semiconductor substrate 3. Above the dielectric layer 7, a semiconductor layer 2a is deposited, which in a preferred embodiment is polycrystalline silicon.

By means of a conventional photolithographic step, an etching of the polysilicon layer 2a is carried out, in order to define at least one elongated strip 2 of polysilicon having a width W. Advantageously, a second strip 20 is defined in the same polysilicon layer 2a.

At this point, a photoresist mask 4 is formed to cover the strip 2 of polysilicon. Whenever a contact region 21 is present, the mask 4 may advantageously also cover it, as shown in FIG. 1. Thereafter, apertures 5 in the mask 4 are formed using conventional photolithographic steps, leaving portions 6 of the strip 2 uncovered.

The apertures 5 can take the form of different geometries. For example, square aperture may be provided which are arranged in a "chessboard" structure or, the apertures can be aligned in rows and columns. Apertures 5 may be rectangular, triangular, circular or of any plan geometrical shape.

In order to make the illustration easier, rectangular apertures 5 are shown, which have a greater width than the width W of the polysilicon strip 2. Advantageously, such apertures 5 occur over the entire length of the polysilicon strip 2.

In this embodiment, the portions 6 of the polysilicon strip 2, which are covered by the mask 4, take the form of parallel tracks and the open mask 4 has a substantially striped aspect.

The apertures 5 obtained in the mask 4 are determined by two geometrical parameters, S and L, where parameter S represents the length in the longitudinal direction X of the strip 2 and parameter L represents the distance that occurs between two subsequent apertures, as illustrated in FIG. 1.

An ion implantation step, for example the implantation of the $BF_2^+$ ion, dopes with boron only the parts of the strip 2 which are left exposed by the mask 4.

After the removal of the mask 4, the structure 1 is subjected to a thermal process that activates and diffuses the dopant inside the polysilicon strip 2.

Because the implanted species diffuse in all directions, by suitably varying the geometrical parameters L and S, it is possible to obtain a resistive strip 2 that, when compared to the unmasked strip 20, has a lower average dopant concentration, and therefore a higher resistance value.

If the two geometrical parameters S and L are the same, and the species diffusion is such to obtain a constant doping profile along the longitudinal direction x of the resistive strip 2, a dopant concentration that is about the half of that of the resistive strip 20, that has no masking, and a value of layer resistance which is about twice are respectively obtained.

If the dimension S is reduced to the limits given by the photolithographic technique, and the distance L is increased, compatibly with the side diffusion of the implanted dopant, average dopant concentrations may be achieved that are even lower.

Because in polycrystalline materials the dopant diffusion length ($L_D=2*(Dt)^{1/2}$—wherein D is the diffusivity of the species implanted in the semiconductor, and t is the diffusion time) is greater than that of corresponding monocrystalline materials, the dimension L may advantageously be greater than that which would be necessary in a monocrystalline material.

This gives an average dose $Dm=(S/(S+L))*Ds$, where Ds is the value of the implanted dose, which is substantially lower than the implanted dose. This happens also if thermal processes are used at temperatures and for times which are lower than those that would be necessary for the monocrystalline semiconductors.

The dopant distribution along the X direction of the polysilicon strip is in this way substantially uniform and gives a high resistivity material with respect to the resistors that are implanted on the entire surface area.

If the diffusion length is lower than the dimension L, high resistivity regions are obtained, which alternate with more conductive regions. This gives a polycrystalline material that has an average resistivity higher than in the case of an uniformly distributed dopant (Ld>>L).

It is further known that, in the case of doping with boron, the lower the dopant concentration the more remarkable the change in resistivity with temperature. For example when the dopant concentration is reduced to values lower than $5*10^{13}$ cm$^{-3}$, an unexpected increase of resistivity is noticed that can bring about drawbacks.

The use of polycrystalline materials, in particular polysilicon, is therefore preferred because it allows the use of lower S / (S+L) ratios with a more uniform dopant distribution, due to the high diffusivity of the dopants.

A non limitative example of a process is described below, which forms two semiconductor strips formed according to an embodiment of the invention.

Two strips 2, 20 formed of polysilicon are defined with a thickness of 2000 Angstroms. A photoresist layer with a thickness of about 5000 Angstroms is deposited in order to form the mask 4 on the strip 2. Then, apertures 5 are obtained whose geometric parameters S and L are 0.5 μm and 1 μm, respectively, using conventional photolithographic processing steps.

A $BF_2^+$ ion implantation is carried out at an energy of 50 KeV and with a dose of $4.5*10^{15}$ cm$^{-2}$ and, once the mask 4 is removed, a layer of oxide is formed and an annealing at 900° C. for 15 minutes in $N_2$ is carried out.

Then, in a conventional way, the steps of opening and defining the contacts for the connection to the metalizing layer follow.

With such operational sequence, resistive strips 20 of about 170 Ohm/square and resistive strips 2, partially protected during the implantation, that reach a value of about 1 kOhm/square may be obtained.

Figure 4:
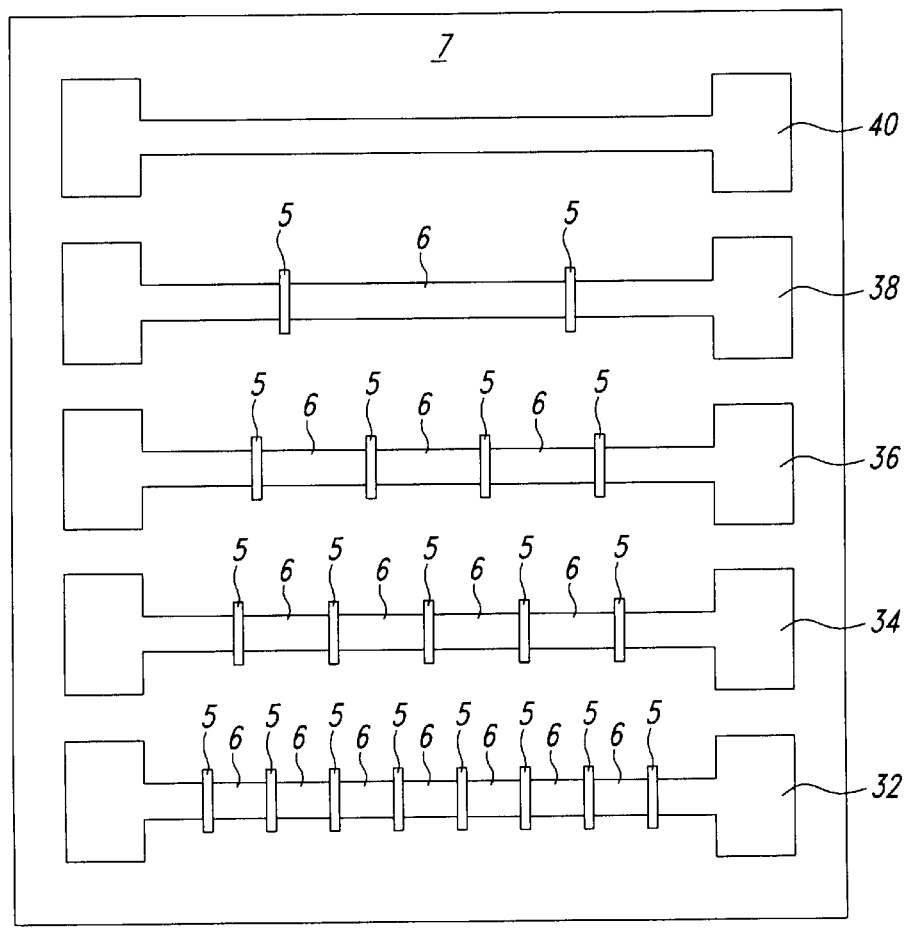
FIG. 4 is an elevational view of a semiconductor resistive structure according to another embodiment of the invention.

In FIG. 4, an embodiment where multiple resistive strips 2 are each prepared with a mask 4 having apertures 5 of different geometries is shown. This exemplifies how multiple resistive strips 32, 34, 36, 38 and 40 can be formed with only one implantation step, yet each resistive strip has its own unique resistivity. In FIG. 4 to enhance understanding, the apertures 5 and the portions 6 of the resistive strips are shown with representative relative geometries; in actual production the number of apertures and portions would be far greater than the number shown.

Figure 5:
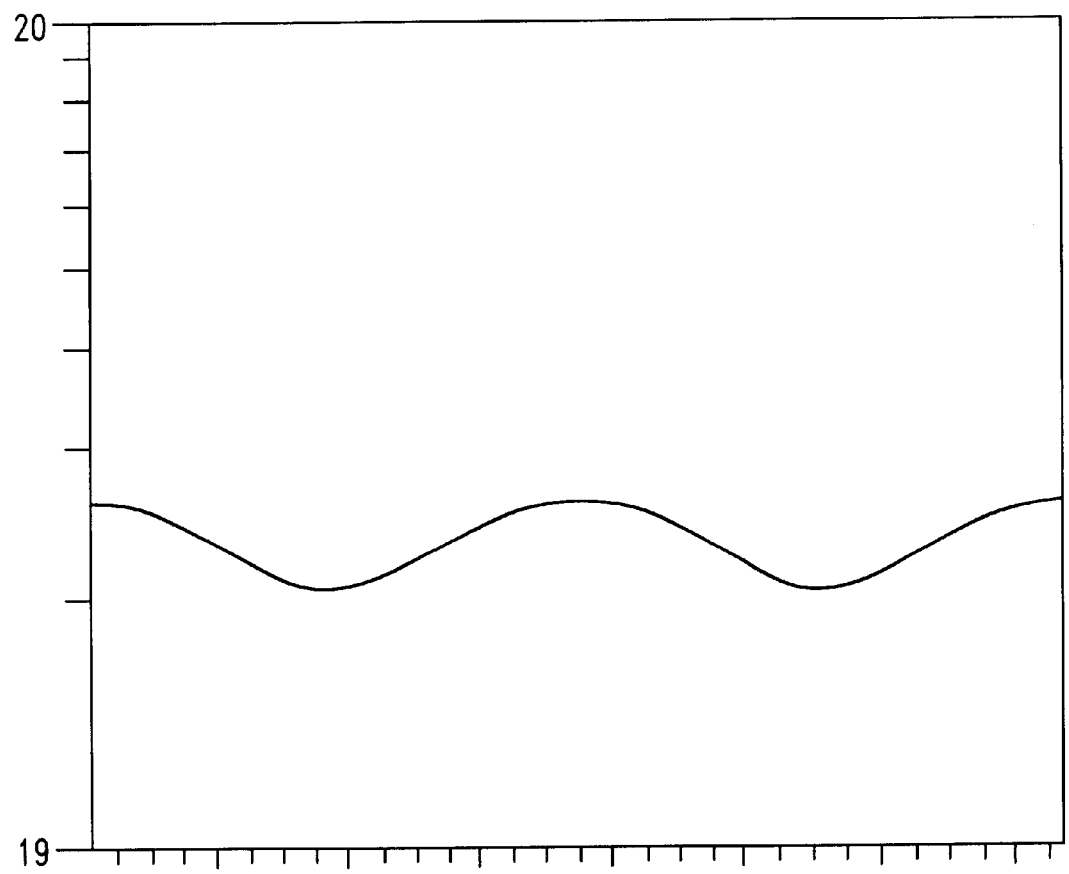
FIG. 5 is a graph diagram plotting the active boron concentration inside the polycrystalline resistive structure versus the length of the structure itself.

In FIG. 5, data relative to a bi-dimensional simulation of a section of the resistive strips carried out along the longitudinal direction X of the component 2 are reported, wherein on the y-axis the concentration of active boron inside the polycrystalline silicon and on the x-axis the length of the polysilicon strip 2 are respectively reported, when apertures 5 are formed whose geometrical dimensions are L=1 μm and S=0.5 μm.

This diagram shows that the concentration of dopant inside the polycrystalline silicon implanted with the process according to this embodiment of the invention is lower than that which would occur if the mask 4 was not formed.

Eventually, if other electronics components already present on the integrated circuit are compatible with thermal processes at higher temperatures and for longer times, it is obviously possible to further increase the parameter L and to obtain more uniform dopant profiles.

In conclusion the choice of a specific geometry for the aperture 5 of the mask 4 depends upon the purpose of obtaining, after the thermal process required for activating and diffusing the dopant, an average concentration of the implanted species which is substantially lower than the polysilicon strips that are not shielded during the implantation.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing a resistive structure including at least one semiconductor strip laid above a semiconductor substrate comprising:
    covering the at least one semiconductor strip with a mask;
    forming a plurality of apertures in the mask until portions of the at least one semiconductor strip are uncovered;
    implanting a dopant in the at least one semiconductor strip through the apertures; and
    heating the resistive structure to diffuse the dopant in the at least one semiconductor strip.

2. The process according to claim 1 wherein the at least one semiconductor strip is polysilicon.

3. The process according to claim 1 wherein the plurality of apertures are rectangular.

4. The process according to claim 1 wherein the plurality of apertures are formed over the entire length of the semiconductor strip.

5. The process according to claim 1 wherein the mask has a substantially striped form.

6. The process according to claim 1 wherein the plurality of apertures are square.

7. The process according to claim 6 wherein the plurality of apertures are arranged in a chessboard pattern.

8. The process according to claim 1 wherein the plurality of apertures are aligned in rows and columns.

9. The process according to claim 1 wherein the plurality of apertures have a triangular or circular shape.

10. The process according to claim 1 wherein the concentration profile of the semiconductor strip is uniform.

11. The method of claim 1 wherein the resistive structure is a first resistive structure of a plurality of resistive structures on the semiconductor substrate, one or more of the resistive structures having different resistivity values, the method comprising:
    forming a plurality of semiconductive layers on the semiconductor substrate;
    covering the plurality of semiconductive layers with a photoresist layer;
    forming openings in a plurality of respective portions of the photoresist layer above the plurality of semiconductive layers, where at least two portions of the photoresist layer include openings having sizes different from one another; and
    implanting a dopant into the plurality of semiconductive layers through the openings in the photoresist layer.

12. The method of claim 11 further comprising heating the semiconductor substrate after implanting a dopant through the openings in the photoresist layer.

13. The method of claim 12 wherein heating the semiconductor substrate comprises baking the semiconductor substrate at 900° C. for 15 minutes in a Nitrogen atmosphere.

14. The method of claim 11 wherein implanting a dopant through the openings in the photoresist layer comprises implanting boron into the semiconductive layers.

15. The method of claim 14 wherein implanting boron into the semiconductive layers comprises implanting a dose of $4.5*10^{15}$ cm$^{-2}$ $BF_2^+$ ions at an energy of 50 KeV.

16. A process for manufacturing a resistive structure, the process comprising:
    laying a semiconductor strip above a semiconductor substrate;
    covering the semiconductor strip with a mask that includes a plurality of apertures that leave uncovered portions of the semiconductor strip;
    implanting a dopants in the semiconductor strip through the apertures; and
    heating the semiconductor strip to diffuse the dopants in the semiconductor strip.

17. The process of claim 16, further comprising forming a dielectric layer on the semiconductor substrate, wherein the semiconductor strip is formed on the dielectric layer.

18. The process of claim 16 wherein the semiconductor strip is polysilicon.

19. The process of claim 16 wherein the plurality of apertures are rectangular.

20. The process of claim 16 wherein the plurality of apertures are formed over the entire length of the semiconductor strip.

21. The process of claim 16 wherein the mask has a substantially striped form.

22. The process of claim 16 wherein the plurality of apertures are arranged in a chessboard pattern.

23. The process of claim 16 wherein the plurality of apertures are aligned in rows and columns.

24. The process of claim 16 wherein the plurality of apertures have a triangular or circular shape.

25. The process of claim 16 wherein the semiconductor strip has a concentration profile that is uniform.

26. The method of claim 16 wherein the resistive structure is a first resistive structure of a plurality of resistive structures on the semiconductor substrate, one or more of the resistive structures having different resistivity values, the method comprising:
    forming a plurality of semiconductive layers on the semiconductor substrate;
    covering the plurality of semiconductive layers with a photoresist layer;
    forming openings in a plurality of respective portions of the photoresist layer above the plurality of semiconductive layers, where at least two portions of the photoresist layer include openings having sizes different from one another; and
    implanting a dopant into the plurality of semiconductive layers through the openings in the photoresist layer.

* * * * *